United States Patent [19]
Wermuth

[11] Patent Number: 4,725,789
[45] Date of Patent: Feb. 16, 1988

[54] CIRCUIT ARRANGEMENT FOR A LOW-NOISE AUDIO FREQUENCY SOURCE

[75] Inventor: Jürgen Wermuth, Peine, Fed. Rep. of Germany

[73] Assignee: Ant Nachrichtentechnik GmbH, Backnang, Fed. Rep. of Germany

[21] Appl. No.: 901,620

[22] Filed: Aug. 29, 1986

[30] Foreign Application Priority Data

Sep. 2, 1985 [DE] Fed. Rep. of Germany ....... 3531274

[51] Int. Cl.$^4$ .............................................. H03F 1/26
[52] U.S. Cl. .................................. 330/149; 330/185; 330/306; 381/94; 381/120
[58] Field of Search ................... 330/75, 86, 149, 185, 330/188, 189, 282, 293, 302, 303, 306; 381/94, 120, 121

[56] References Cited

U.S. PATENT DOCUMENTS 3,501,711 3/1970 Moran ............................ 330/293 X

FOREIGN PATENT DOCUMENTS 2925049 3/1982 Fed. Rep. of Germany .

Primary Examiner—James B. Mullins
Attorney, Agent, or Firm—Spencer & Frank

[57] ABSTRACT

A circuit arrangement for coupling alternating voltage signals having frequencies within the audio frequency range between a low noise audio frequency source and a zero ohm amplifier, wherein the audio frequency source has a known source impedance. The circuit arrangement includes an output connected to the zero ohm amplifier and a highly resistant input for receiving the alternating voltage signals from the audio frequency source. The input is more resistant by at least one power of ten than the source impedance of the audio frequency source and the arrangement has a voltage amplification factor which is so low that no overshooting of the output signal will happen at the maximum occurring voltage of the signals received at its input. The output of the arrangement is configured as a short-circuit resistant alternating current source which furnishes a maximum effective current of at least 10 mA. The equivalent noise resistance of the arrangement is maintained to be at most 20% of the equivalent noise resistance of the audio frequency. Any branch circuit included in the arrangement and connected to its output is so highly resistant that the internal gain of the subsequently connected zero ohm amplifier is not raised significantly, thereby causing no significant increase in noise in the zero ohm amplifier.

13 Claims, 4 Drawing Figures

CIRCUIT ARRANGEMENT FOR A LOW-NOISE AUDIO FREQUENCY SOURCE

BACKGROUND OF THE INVENTION

The present invention relates to a circuit arrangement for coupling alternating voltage signals in the audio frequency range between a low noise audio frequency source and a zero ohm amplifier, wherein the circuit arrangement has a highly resistant input which is more resistant by at least one power of ten than the source impedance of the audio frequency source and the amplification of the circuit arrangement is so low that no overshooting will happen at the maximum occurring voltage of the voltage signals received at the input of the circuit arrangement.

Such a circuit arrangement is disclosed in German Pat. No. 2,925,049. It can be used to particular advantage if a microphone, for example a capacitor microphone or a dynamic microphone, preferably with a subsequently connected transformer which transforms the microphone output voltage up somewhat, is to be connected to a so-called zero ohm or zero node amplifier. The present invention is particularly useful if the zero ohm amplifier is a controlled, particularly a voltage controlled, amplifier, i.e., a so-called VCA.

German Pat. No. 2,925,049 refers to a specific VCA configuration, but the present invention can also be used for other VCA's in which generally, as in the prior art reference, an operational amplifier with nonlinear feedback is provided in the input stage.

The principles of the prior art arrangement are illustrated in FIG. 1. An audio frequency source T, including a microphone M and a subsequently connected transformer Ü, is connected to a gain controlled, zero ohm amplifier N which is essentially composed of an operational amplifier OP with a controllable (variable) feedback resistance V. The zero ohm amplifier has a very low input resistance of approximately 0 ohm which ordinarily would present too much of a load current for the audio frequency source T. Therefore, an impedance converter W is connected therebetween, whose positive output resistance is significantly less than its input resistance and whose voltage amplification has been selected to be so small that no overshooting will happen at its maximum occurring input voltage. Between impedance converter W and zero ohm amplifier N there is also a series resistor L whose resistance value is relatively low so that it does not contribute much noise. However, series resistor L cannot be completely omitted because otherwise the output of impedance converter W would be stressed too much by the low input resistance of zero ohm amplifier N.

Additionally, series resistor L is also responsible for the noise contribution made by the operational amplifier OP itself. This noise contribution can be considered to originate from a noise voltage source directly at the inverting input of operational amplifier OP. The noise voltage of the noise voltage source is amplified by the operational amplifier with V and L connected as shown, wherein the so-called internal gain of zero ohm amplifier N increases as the resistance value L decreases.

With the configuration shown in FIG. 1, the impedance converter W and the relatively small series resistor L still contribute such large amounts of noise, due to the increase of the internal gain of zero ohm amplifier N, that the latter would have to be designed to be correspondingly lower in noise if stricter requirements for a signal with even less noise at the output of the zero ohm amplifier are to be met. However, it has been found to be very difficult and expensive to design a variable gain zero ohm amplifier so that it is correspondingly low in noise.

SUMMARY OF THE INVENTION

Accordingly, it is an object of the invention to provide a circuit design which, although it does not avoid the need for expert measures in designing circuit components that are low in noise, it does make it possible to concentrate these measures less on the zero ohm amplifier and more on other circuit components where experience has shown that the costs for such measures are less.

The above and other objects are accomplished in accordance with the invention in the context of a circuit arrangement for coupling alternating voltage signals having frequencies within the audio frequency range between a low noise audio frequency source and a zero ohm amplifier, wherein the audio frequency source has a known source impedance and the circuit arrangement includes an output connected to the zero ohm amplifier and a highly resistant input for receiving the alternating voltage signals from the audio frequency source, the input being more resistant by at least one power of ten than the source impedance of the audio frequency source, and the arrangement having a voltage amplification factor which is so low that no overshooting of the circuit arrangement will happen at the maximum occurring voltage of the alternating voltage signals received at the input of the circuit arrangement. According to the invention, the output of the circuit arrangement is configured as a short-circuit resistant alternating current source which furnishes a maximum effective current of at least 10 mA; the equivalent noise resistance of the circuit arrangement is at most 20% of the equivalent noise resistance of the audio frequency; and any shunt branch circuit which is connected to the circuit arrangement output is so highly resistant that the internal gain of the subsequently connected zero ohm amplifier is not raised significantly, thereby causing no significant increase in noise in the zero ohm amplifier.

The invention is based on the following considerations:

The series resistor L in FIG. 1 should be as small as possible so that it does not contribute much noise. However, series resistor L should also have the highest possible value to keep the internal gain of operational amplifier OP low and also because it is advantageous that the ratio of resistance values V to L does not become too high. That is, with too high a ratio of these values, which ratio is determinative of the gain of the feedback connected zero ohm amplifier N, the feedback becomes so weak and the gain comes so close to the no-load gain of operational amplifier OP that the upper limit frequency of this no-load gain becomes annoying noticeable.

Moreover, due to the low input resistance of zero ohm amplifier N, with too low a value for series resistor L, the output of impedance converter W would be substantially short-circuited which would result in a malfunction in conventional impedance converters. Zero ohm amplifier N would then no longer receive a signal which lies sufficiently high above the noise.

The present invention overcomes the foregoing difficulties by recognizing that a circuit arrangement of the above type can be designed, firstly, with low noise and at low cost, for example as a controllable zero ohm amplifier; secondly, that it can be relatively easily designed so that it furnishes to the zero ohm amplifier a signal in the form of a current which is sufficiently far above the noise; and, thirdly, that it need not contribute noticeably to an increase in the internal gain of the zero ohm amplifier.

BRIEF DESCRIPTION OF THE DRAWINGS

The invention will be described in greater detail with reference to the accompanying drawings wherein.

DESCRIPTION OF THE PREFERRED EMBODIMENT

Figure 1:
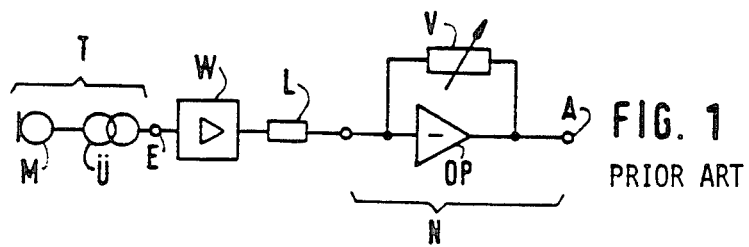
FIG. 1 is a block circuit diagram of a circuit arrangement according to the prior art.
Figure 2:
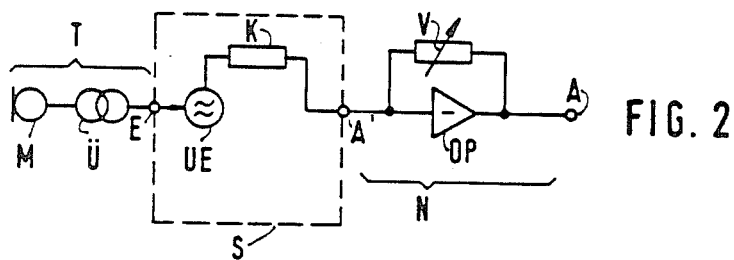
FIG. 2 is an equivalent circuit diagram of a circuit arrangement according to the invention.

In FIG. 2, impedance converter W and series resistor L of FIG. 1 have been replaced by a circuit arrangement S including an input E and an output A'. This is a short-circuit resistant alternating current source, i.e. a source having a very high internal impedance K which is fed by an equivalent voltage source UE that furnishes very high voltage values and follows the voltage across input E. This alternating current source supplies a signal in the form of a current sufficiently high above the noise at point A' at the input to zero ohm amplifier N so that the inherent noise of zero ohm amplifier N is less a contributing factor than in the arrangement according to FIG. 1.

The operation of the circuit arrangement according to FIG. 2 can be explained with the aid of the known equation for voltage amplification in a feedback connected operational amplifier, i.e. the amplification factor (gain) corresponds to the ratio of V to K. Although this quotient is low because of the high internal impedance K, i.e. the output voltage is weakened, the output voltage of zero ohm amplifier N will still be higher than in FIG. 1 since the equivalent voltage source UE furnishes a very high voltage.

The circuit arrangement S in FIG. 2 must be designed to be low in noise so that the equivalent noise resistance of audio frequency source T together with the subsequently connected circuit arrangement S lies no more than 20%, preferably no more than 10%, higher than the equivalent noise resistance of audio frequency source T alone. This can be accomplished in that the internal impedance K, which is an alternating current resistance, is of an ohmic nature only to a very small percentage. The noise effect of this ohmic component can be imagined as follows: if the equivalent voltage source UE is short-circuited, and a noise voltage source replaces the ohmic component of internal impedance K, it can be seen that the resulting relatively low noise voltage is amplified by zero ohm amplifier N only with a very small ratio of V to K.

Figure 3:
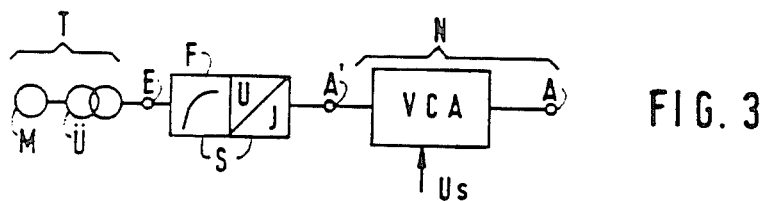
FIG. 3 is a block circuit diagram of a preferred embodiment of a circuit arrangement according to the invention.

The manner in which the high internal impedance K can be realized with a low ohmic component and with otherwise low noise contributions will be described below with the aid of the circuit schematic of FIG. 4, for which FIG. 3 gives the block circuit diagram. Referring to FIG. 3 it can be seen that circuit arrangement S has two components, namely an infrasound filter F, also called an impact sound filter, and an actual alternating current source U/J which converts the voltage across input E into a current at output A'. Zero ohm amplifier N is shown as a VCA which is controlled by a control voltage Us.

Figure 4:
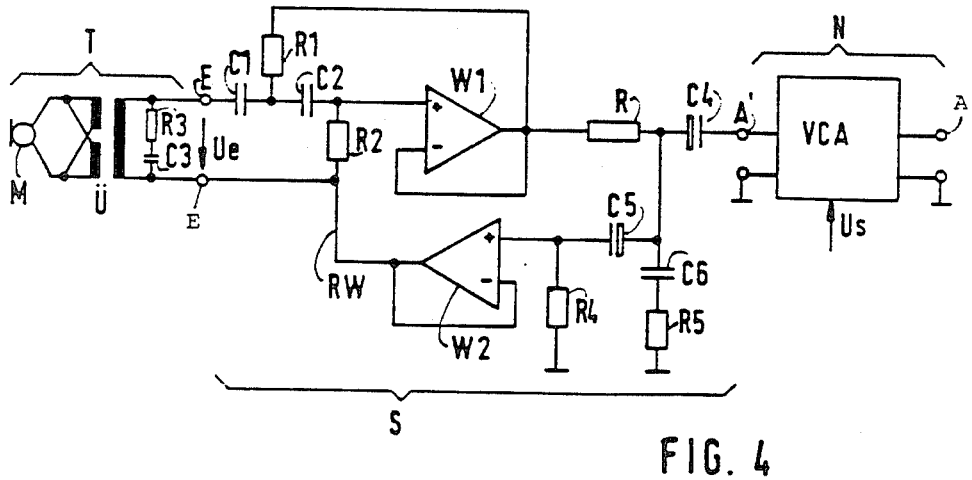
FIG. 4 is a circuit schematic of a preferred embodiment of the invention.

FIG. 4 illustrates a preferred embodiment of circuit arrangement S. The significant components are a first impedance converter W1 in the form of an operational amplifier which is high ohmic at its input, i.e. higher ohmic by several powers of ten that at its output, and has a voltage gain of one. This is realized by a strong negative feedback using a connection from the output to the negative input of the operational amplifier comprising impedance converter W1 and by a following series connected resistor R at which voltage Ue at input terminals E of circuit S is imaged. A second impedance converter W2 is disposed in a feedback path RW which bridges resistor R and the input of impedance converter W1. Impedance converter W2 is of the same type as W1 and takes care that voltage Ue is imaged correctly at series resistor R. To understand this, it must be considered that output A' is practically at ground potential with respect to alternating voltage due to the approximately zero ohm input of the VCA. However, impedance converter W2 also keeps the terminal of transformer Ü which is connected with feedback path RW at ground potential. Signals Ue coming from transformer Ü are imaged to series resistor R by a gain of one of impedance converter W1.

In order for the voltage Ue, which images the input voltage, to be available at series resistance R, there must be a current flowing through R. As the resistance R is situated between the low-resistance output of W1 and the high-resistance input of W2, current can flow out only via the input A' of zero ohm amplifier N. The high resistance of the alternating current source formed by S can be explained by the consideration that an alternating shift in potential at A', although it would shift the potential across both terminals (via the transformer coil) of input E, remains without influence on Ue and thus on the current through R.

The illustrated circuit arrangement S forms a short-circuit resistant alternating current source which, with an effective alternating output current of a maximum of 50 mA, furnishes such a strong signal to the VCA that its freedom from noise requirements need not be too high. Another contributing factor for this is that circuit arrangement S itself contributes only little to the noise.

If a dynamic microphone having an internal resistance of 200 ohm and a transformer having a transforming ratio of 1:2 are selected as microphone M, the source impedance of audio frequency source T is 800 ohm. Added to these noise contributions is the equivalent noise resistance of circuit arrangement S, wherein each operational amplifier makes a contribution corresponding to an equivalent noise resistance of about 40 ohm. Added to this is the effect of series resistance R which may, for example, be 100 ohm. In consideration of the noise, this resistance R should be selected to be as small as possible, but must not be too small so that the current flowing into the VCA is not too high.

The voltage gain of circuit arrangement S is almost zero. Its internal signal rise corresponds to the maximum occurring input voltage. This is applicable to an amplification range from 140 to 150 dB. The input impedance of circuit arrangement S is at least ten times larger than the source impedance of audio frequency source T so that the latter does not receive too much of a load and the signal to noise ratio is not noticeably worsened by an unfavorable voltage divider ratio.

The transformation ratio of transformer Ü in a dynamic microphone is preferably 1:2 (up to 1:3) and for a capacitor microphone preferably about 1:1. A larger transformation ratio would actually be desirable, but then it becomes difficult to process the high voltages developing across input E without distortion in circuit arrangement S.

Circuit arrangement S also includes an infrasound filter. Such a filter eliminates oscillations of less than 16 Hz. Though these oscillations are not audible, they can interfere with the blameless functioning of the VCA and of impedance converter W1. It is a particular advantage of the present invention and particularly of the embodiment according to FIG. 4 that this infrasound filter need not be arranged, as in the prior art, downstream of the VCA, but is disposed upstream of the positive input of impedance converter W1. The infrasound filter is composed of the two resistor-capacitor combinations R1-C1 and R2-C2. With the arrangement of the infrasound filter downstream of the VCA, it was possible that the preliminary stages were already overshot by impact sound. This is not only avoided in the arrangement according to FIG. 4, but it is avoided without the integrated infrasound filter significantly adversely influencing the noise behavior of circuit arrangement S.

A further R3-C3 combination serves to improve the characteristics of transformer Ü.

Finally, there are coupling capacitors C4, C5, resistors R4, R5 and a capacitor C6 at output A'. R5 and C6 serve only to prevent a possible tendency of the VCA to resonate. The capacitance of C6 is very low, with an alternating current resistance which is less than R4 in the useful frequency range. This shunt or transversely connected resistance R4 has a value on the order of magnitude of 20k ohm and is thus so highly ohmic that it does not noticeably increase (preferably no more than 10%) the internal gain of zero ohm amplifier N.

The present disclosure relates to the subject matter disclosed in German Ser. No. P 35 31 274.2 of Sept. 2, 1985, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. In a circuit arrangement for coupling alternating voltage signals having frequencies within the audio frequency range between a low noise audio frequency source and a zero ohm amplifier having a very low input resistance, the audio frequency source having a known source impedance and the circuit arrangement including: an output connected to the input of the zero ohm amplifier and a highly resistant input for receiving the alternating voltage signals from the audio frequency source, the input being more resistant by at least one power of ten than the source impedance of the audio frequency source and said arrangement having a voltage amplification factor which is so low that no overshooting will happen at the output of the circuit arrangement at the maximum occurring voltage of the alternating voltage signals received at the input of the circuit arrangement, the improvement wherein: said circuit arrangement is configured, at least at its said output, as a short-circuit resistant alternating current source which furnishes a maximum effective current of at least 10 mA at said output, and has an equivalent noise resistance which is at most 20% of the equivalent noise resistance of the audio frequency source; and any shunt branch circuit connected to said output is so highly resistant that the internal gain of the subsequently connected zero ohm amplifier is not raised significantly, thereby causing no significant increase in noise in the zero ohm amplifier.

2. Circuit arrangement as defined in claim 1, wherein the equivalent noise resistance of said circuit arrangement is at most 10% of the equivalent noise resistance of the audio frequency source.

3. Circuit arrangement as defined in claim 1, wherein said shunt branch circuit is so highly resistant that the internal gain of the zero ohm amplifier is increased by no more than 10%.

4. Circuit arrangement as defined in claim 1, wherein said short circuit resistant current source comprises: a first impedance converter having an output, and a highly resistant input which is more resistant by several powers of ten than the output of said first impedance converter and which constitutes said input of said circuit arrangement;

a resistor connected in electrical series with the output of said first impedance converter and said output of said circuit arrangement; and a feedback circuit bridging said resistor and the input of said first impedance converter, said feedback circuit including a second impedance converter having an output and a highly resistant input which is more resistant by several powers of ten than the output of said second impedance converter;

wherein said circuit arrangement has maximum voltage gain of one between its input and output.

5. Circuit arrangement as defined in claim 4, wherein said first and second impedance converters each have a voltage gain of approximately one.

6. Circuit arrangement as defined in claim 5, further comprising first and second input terminals for said circuit arrangement; and wherein: said first impedance converter is a first operational amplifier having a strong negative feed back path connected between its output and its negative input, and its positive input connected to said first input terminal; said second impedance converter is a second operational amplifier having a strong negative feed back path connected between its output and its negative input, its positive input connected to said output of said circuit arrangement, and its output connected to said second input terminal; a resistor is connected between said positive input of said first operational amplifier and said second input terminal; and a resistor, constituting said shunt circuit, is connected between said positive input of said second operational amplifier and ground.

7. Circuit arrangement as defined in claim 6 further comprising: a first series coupling capacitor connected in series between said resistor connected in series with the output of said first impedance converter and said output of said circuit arrangement; and a second series coupling capacitor connecting said positive input of said second operational amplifier to said output of said circuit arrangement via said first series coupling capacitor.

8. Circuit arrangement as defined in claim 6, further comprising further circuit means, connected to said positive input of said first operational amplifier, for causing said circuit arrangement to simultaneously form an active infrasound filter.

9. Circuit arrangement as defined in claim 8 wherein said further circuit means comprises: first and second series connected capacitors connected between said first input terminal and said positive input of said first operational amplifier; and a feedback resistor connected between the output of said first operational amplifier and the common junction of said first and second series connected capacitors.

10. Circuit arrangement as defined in claim 1, further comprising means included in said circuit arrangement for causing said circuit arrangement to simultaneously form an active infrasound filter.

11. Circuit arrangement as defined in claim 1, wherein the zero ohm amplifier has a variable gain.

12. Circuit arrangement as defined in claim 1 wherein the input resistance of said zero ohm amplifier is a maximum of only a few ohms.

13. Circuit arrangement as defined in claim 12 wherein said input resistance of said zero ohm amplifier is approximately zero ohms.

* * * * *